(12) United States Patent
Reschke et al.

(10) Patent No.: US 8,525,288 B2
(45) Date of Patent: Sep. 3, 2013

(54) SCHOTTKY DIODE WITH IMPROVED HIGH CURRENT BEHAVIOR

(75) Inventors: Michael Reschke, Potsdam (DE); Hans-Jurgen Hillemann, Beelitz OT Fichtenwalde (DE); Klaus Gunther, Kleinmachnow (DE)

(73) Assignee: Eris Technology Corporation, Shenkeng Township (TW)

( * ) Notice: Subject to any disclaimer, the term of this patent is extended or adjusted under 35 U.S.C. 154(b) by 335 days.

(21) Appl. No.: 12/762,844

(22) Filed: Apr. 19, 2010

(65) Prior Publication Data

US 2010/0283115 A1 Nov. 11, 2010

(30) Foreign Application Priority Data

Apr. 25, 2009 (DE) .......................... 10 2009 018 971

(51) Int. Cl.
*H01L 29/872* (2006.01)

(52) U.S. Cl.
USPC ..... 257/484; 257/471; 257/473; 257/E29.338

(58) Field of Classification Search
USPC .......................................... 257/484, 471–473
See application file for complete search history.

(56) References Cited

U.S. PATENT DOCUMENTS

| | | | |
|---|---|---|---|
| 4,206,540 A | 6/1980 | Gould | |
| 5,345,101 A * | 9/1994 | Tu ................................ | 257/495 |
| 6,177,712 B1 | 1/2001 | Miyasaka | |
| 6,184,545 B1 | 2/2001 | Werner et al. | |
| 6,225,653 B1 | 5/2001 | Igel et al. | |
| 6,515,345 B2 * | 2/2003 | Robb et al. ..................... | 257/551 |
| 2003/0207536 A1 | 11/2003 | Miyasaka et al. | |

FOREIGN PATENT DOCUMENTS

| | | |
|---|---|---|
| DE | 19740195 | 3/1999 |
| DE | 19939484 | 3/2000 |
| EP | 0149401 | 7/1985 |
| EP | 1003218 | 5/2000 |
| JP | 48-23334 | 7/1973 |
| JP | 02-151067 | 6/1990 |
| JP | 10-173205 | 6/1998 |
| JP | 2000-164894 | 6/2000 |
| JP | 2003-101039 | 4/2003 |
| JP | 2008-034646 | 2/2008 |

\* cited by examiner

*Primary Examiner* — Thanh Nguyen
(74) *Attorney, Agent, or Firm* — Hamre, Schumann, Mueller & Larson, P.C.

(57) ABSTRACT

In the diffusion region (3) of the second conductivity mode, a more highly doped region of the same conductivity mode (5) is introduced in such a manner that the region of the first conductivity mode (2) which is covered by the metal silicide (9) and of the second conductivity mode (3) are connected in a conductive manner. The region (3) of the second conductivity mode is diffused in such a manner that it reaches the more highly doped region (1) of the first doping type (1), with an outward diffusion of the doping from the more highly doped substrate layer (1) into the more weakly doped layer (2) of the same conductivity mode in the direction of the semiconductor surface taking place at the same time.

3 Claims, 6 Drawing Sheets

1  n+ epitaxial substrate
2  n epitaxial layer
3  p diffusion region
4  linearisation ring
5  p+ rise
6  therm oxide
7  LTO
8  metal
9  Schottky barrier 10  p/n+ junction
11  p/n junction
12  n/n+ junction

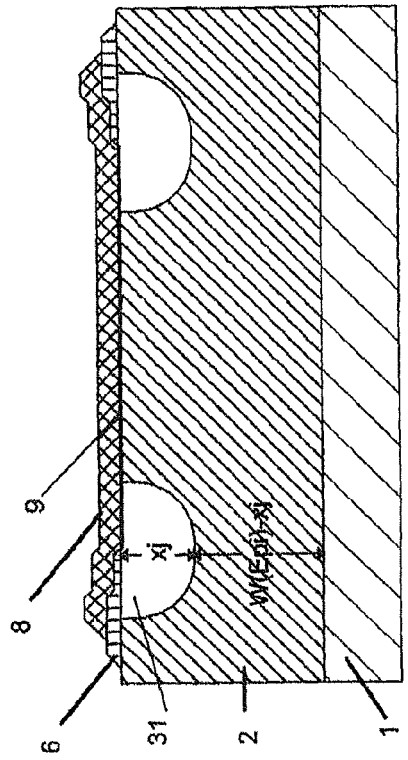
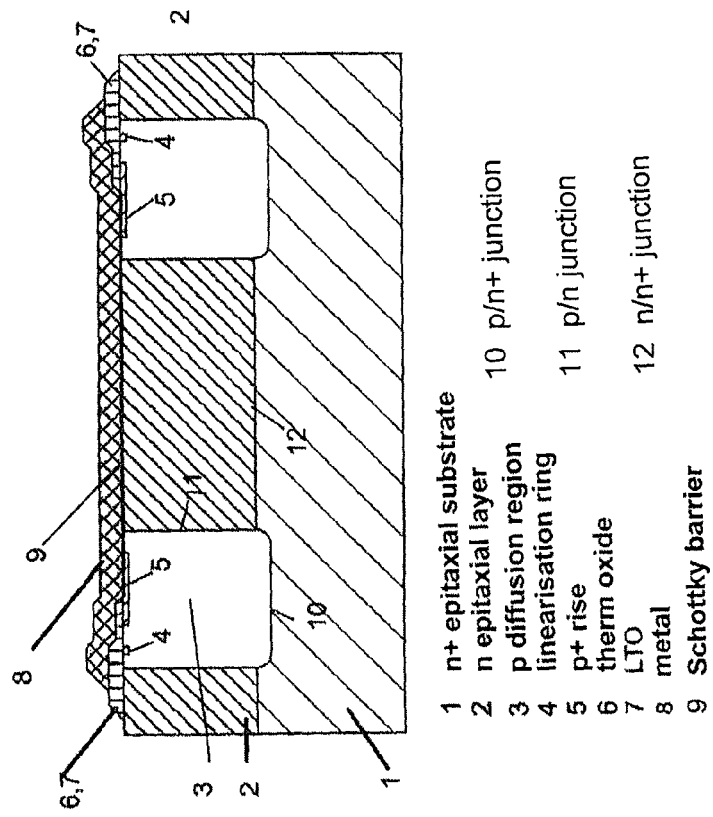

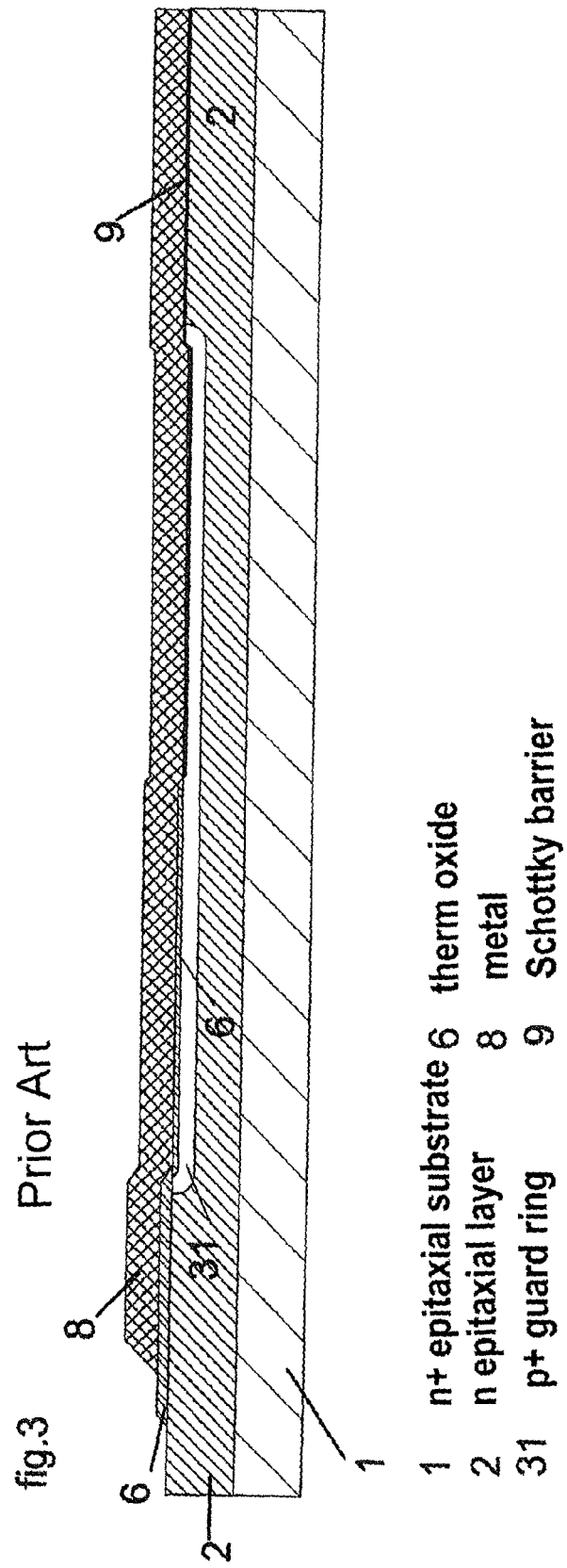

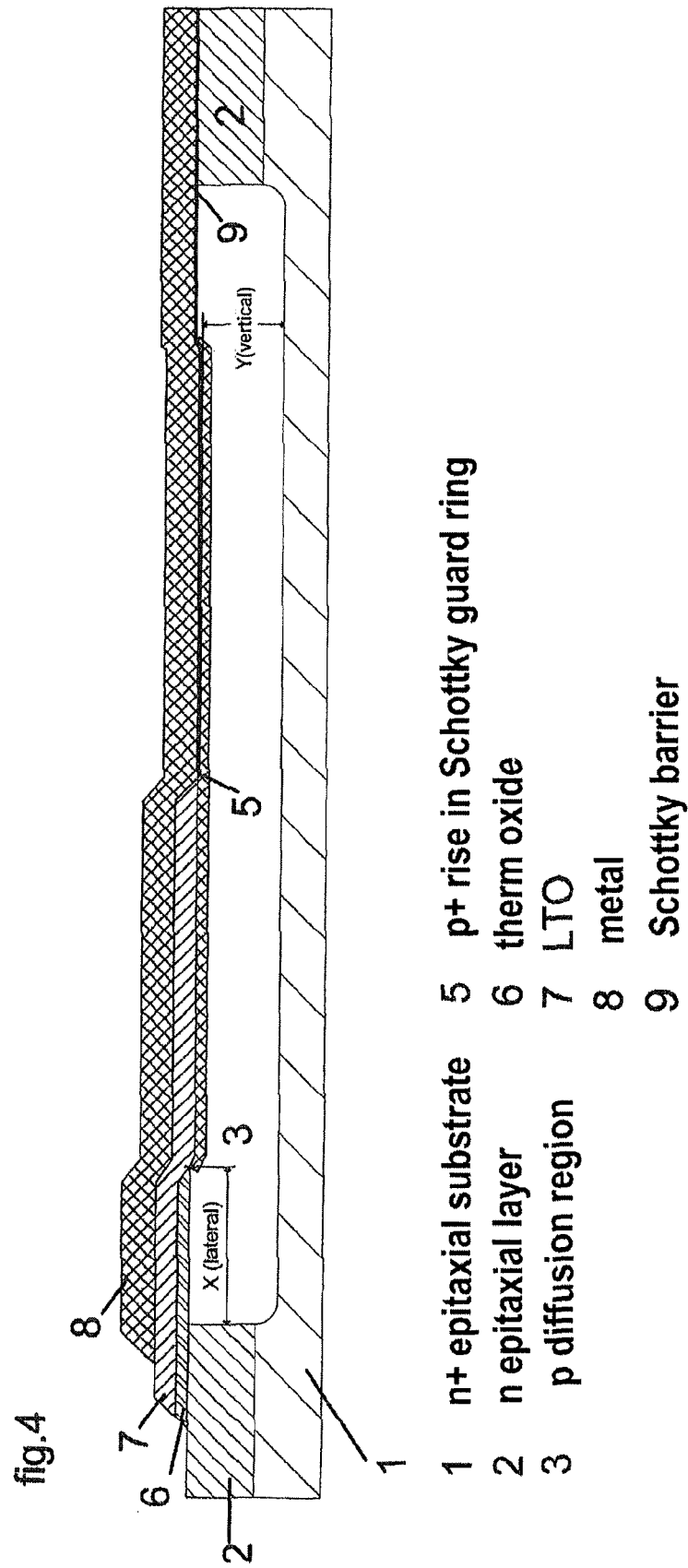

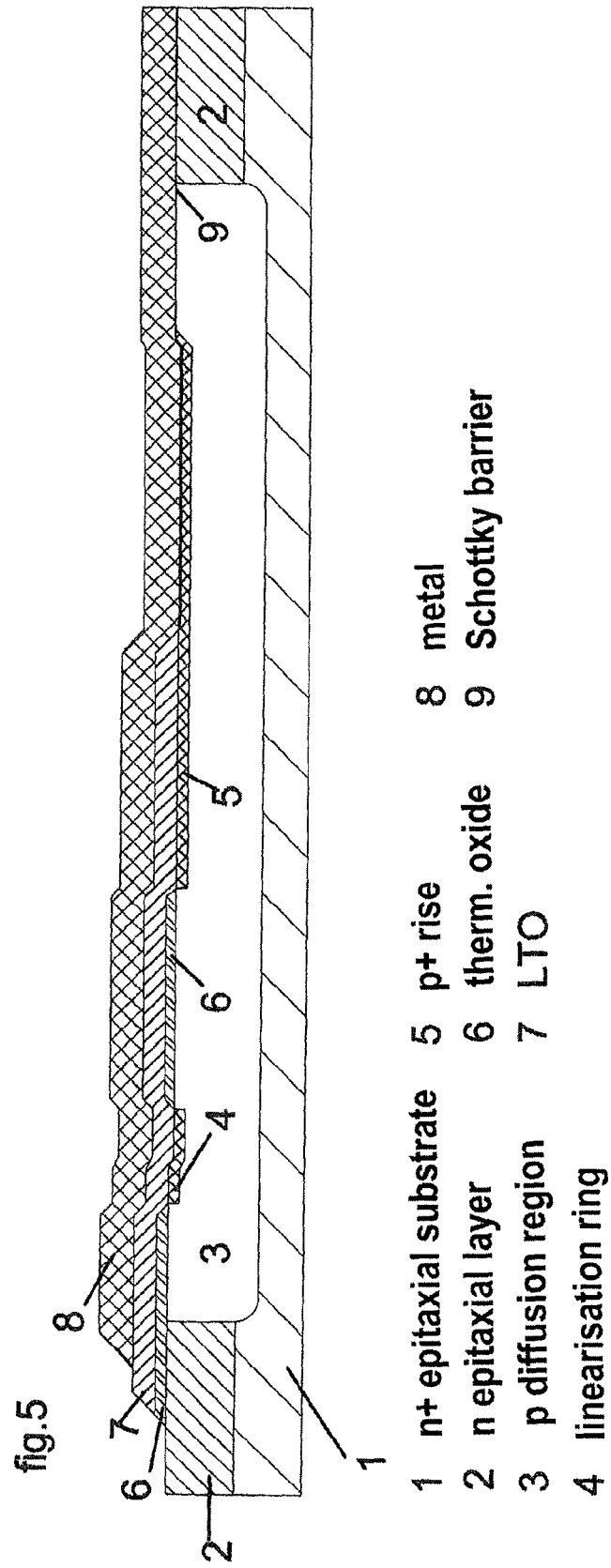

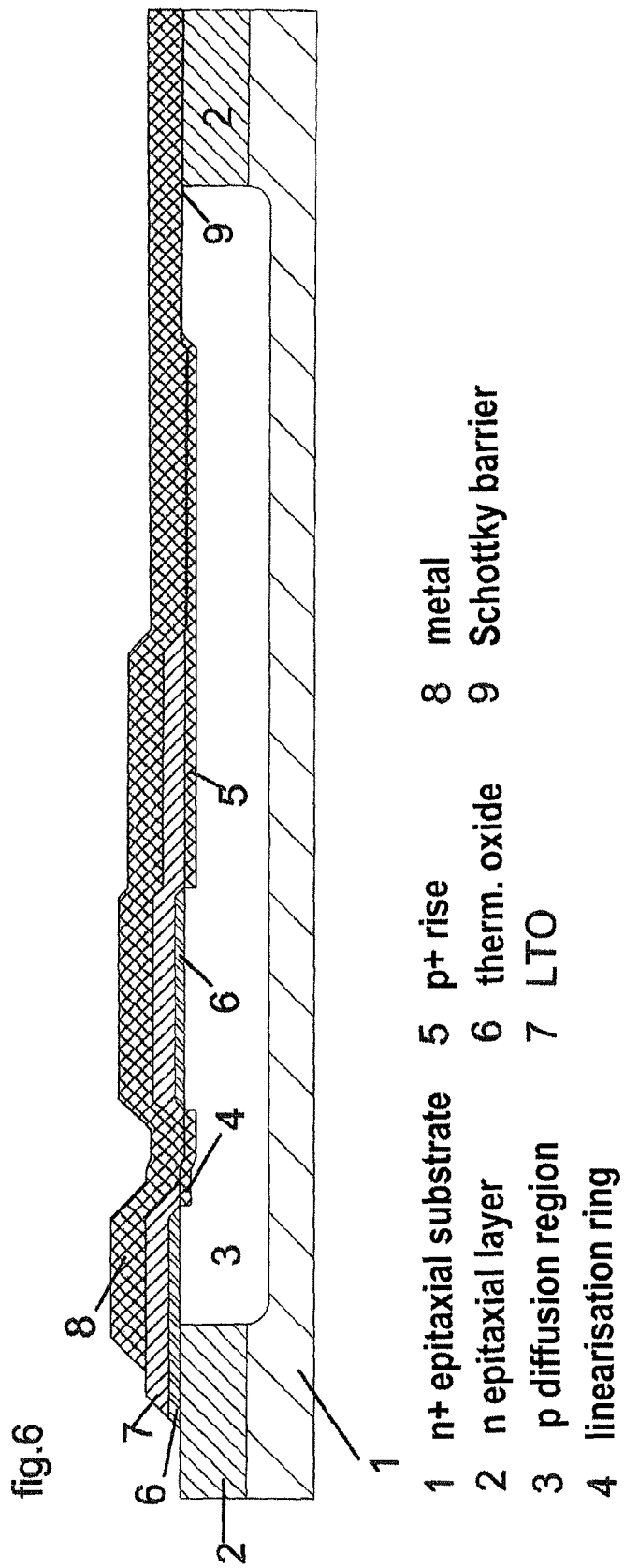

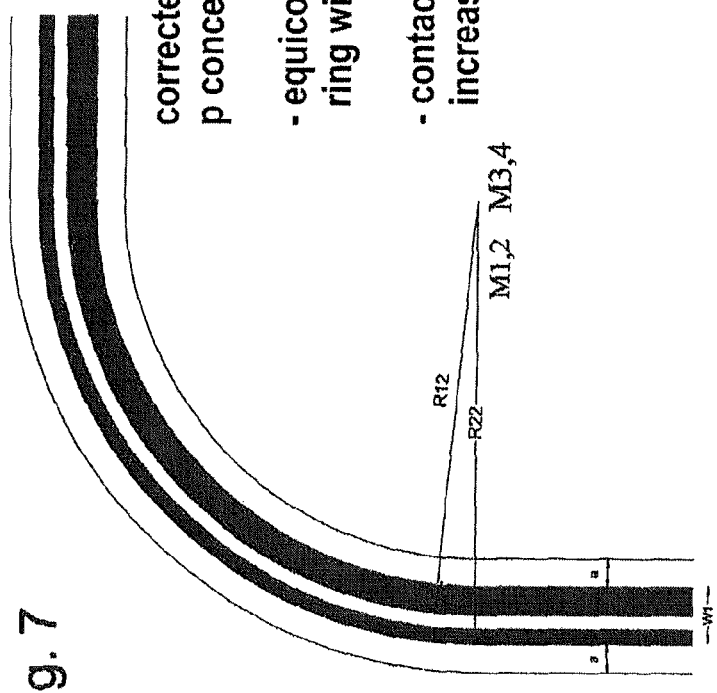

SCHOTTKY DIODE WITH IMPROVED HIGH CURRENT BEHAVIOR

FIELD OF APPLICATION OF THE INVENTION

The invention relates to a semiconductor component with a Schottky barrier junction and the production thereof. The invention in particular relates to the improvement of the voltage strength in reverse mode and surge current strength in forward mode while at the same time reducing the forward voltage drop compared to conventional embodiments. A method for producing the construction is specified.

KNOWN TECHNICAL SOLUTIONS

Schottky diodes are rectifying semiconductor arrangements which consist of a weakly doped semiconductor layer (2) of a first doping and a metal layer which is deposited thereon, with the direct junction layer from the semiconductor to the metal being known as a Schottky contact. The typical details of a Schottky diode are shown in the U.S. Pat. No. 4,206,540. In the German patent DE 199 39 484 is the description of a typical guard ring construction. FIG. 1 shows such an arrangement schematically. For improved current yield, the more weakly doped semiconductor layer of the first doping which is necessary for producing the Schottky contact (9) is applied to a highly doped substrate (1) also with a first doping. It is conventional to limit the maximum voltage load by introducing a pn junction lying parallel to the Schottky junction, which takes place by diffusion of a region (31) of the second doping type and which surrounds the Schottky contact in an annular manner. Schottky diodes are limited constructively to narrow voltage ranges with regard to their ability to withstand reverse voltages, with the remaining layer thickness of the more weakly doped semiconductor layer of the first doping type between the diffusion front of the second doping type and the highly doped substrate layer of the first doping type defining the maximum reverse voltage which can be achieved by the parallel pn diode. In the event that an applied reverse surge voltage exceeds the protected voltage range, an avalanche breakdown takes place in the guard ring area of the arrangement, which can lead to destruction of the diode. A known technical solution is disclosed in U.S. Pat. No. 6,177,712, wherein a relatively weakly doped guard ring of the second conductivity mode contributes to the widening of the electrical field in the critical area so that the breakdown takes place later.

OBJECT OF THE INVENTION

The object of the invention is to increase the reverse current strength of Schottky barrier diodes of the general type while at the same time minimising the forward voltage drop by means of a suitable construction. It is irrelevant whether they are Schottky diodes on an n-conducting or p-conducting epitaxial layer. Furthermore, the embodiment according to the invention is applicable to all semiconductor materials and crystal orientations which are considered for Schottky diodes.

DESCRIPTION OF THE INVENTION

The structure according to the invention of the arrangement is explained below using FIG. 2. A significant stabilisation of the high current behaviour with minimisation of the forward voltage drop at the same time is achieved according to the invention in that, in the diffusion region (3) of the second doping type, a more highly doped region of the same conductivity mode (5) is introduced in such a manner that the region of the first conductivity mode (2) which is covered by the barrier metal silicide (9) and the second conductivity mode (3) are connected in a conductive manner. The region (3) of the second conductivity mode is diffused in such a manner that it reaches the more highly doped region (1) of the first conductivity mode (1), with at the same time an outward diffusion of the dopand taking place in the direction of the semiconductor surface from the more highly doped substrate layer (1) into the more weakly doped layer (2) of the same conductivity mode. The impurity concentration in the region (3) of the second conductivity mode is to be selected such that it is higher than the impurity concentration in the epitaxial layer (2) of the first conductivity mode. The invention differs from the standard variant of a highly doped guard ring area (31) of the second conductivity mode in a more weakly doped epitaxial layer (2) of the first conductivity mode. In return, the inhibiting junctions are now vertical from the region (3) to the substrate (1), in the presented example without loss of generality a pn+ junction (10) and a laterally aligned pn junction (11) from the region (3) of the second conductivity mode to the epitaxial layer (2) of the first conductivity mode. The propagation of the depletion region takes place in the vertical direction primarily into the p-region (3) and in the lateral direction both into the p-region (3) and also into the n epitaxial layer (2), as this is a quasilinear junction because of the doping conditions. In order to limit penetration of the depletion region laterally into the p-region (3) at the surface, a p+ enhancement layer (5) is according to the invention implanted in the central, near-surface area of (3).

A further measure for widening the electrical field in the surface area of the diffused region (3) consists in introducing a linearization ring (4) of the second doping type, which is produced at the same time as the introduction of the region (5) (see FIG. (5)). This introduced region (4) can be connected to the metal layer (8) above it for better potential homogenisation in the guard ring (FIG. 6). In doing so, it is achieved that the surge current strength increases in reverse mode, as an equilinearization of the electrical field takes place along the p-region. This produces a homogenisation of the field in the corners of the guard ring which are particularly at risk of breakdown.

DETAILED DESCRIPTION OF THE INVENTION

The idea according to the invention with its essential details is explained below using the drawings. In the figures:

FIG. 1 shows a cross section through a Schottky diode of the conventional type with a guard ring arrangement.

FIG. 2 shows a Schottky diode with a guard ring according to the invention.

FIG. 3 shows a detailed illustration of the guard ring area of a conventional Schottky diode.

FIG. 4 shows a detailed illustration of the guard ring area of an exemplary embodiment according to the invention.

FIG. 5 shows a cross section through a semiconductor arrangement according to the invention with an implanted linearization ring.

FIG. 6 shows a cross section through a semiconductor arrangement according to the invention with a metallised linearization ring.

FIG. 7 shows part of the equipotential ring for field linearization in the corner area of the guard ring.

A semiconductor arrangement of the conventional type which is reproduced in FIG. 1 shows the cross section through a Schottky barrier diode in which a more weakly doped epitaxial layer (2) of the first conductivity mode has been applied to a highly doped substrate (1) of the same conductivity mode. The pn junction of the diffused guard ring region (31) is connected electrically parallel to the Schottky junction (9), with the difference $W_{Epi}-x_j$ of the layer thickness $W_{Epi}$ of the more weakly doped layer of the first conductivity mode (2) and the depth $x_j$ of the pn junction of the diffused guard ring zone (31) of the second conductivity mode defining the maximum breakdown voltage which can be achieved with the guard ring.

The metal semiconductor layer (9) which forms the Schottky contact partially overlaps the surface of the guard ring (31). The epitaxial layer thickness of the first conductivity mode $W_{Epi}$ which is necessary here is produced from the residual layer thickness $W_{Epi}-x_j$ under the guard ring which is necessary for the voltage class plus an additional thickness $\Delta x_{Epi}$, which corresponds to the penetration depth of the guard ring of the respective voltage class. The disadvantage of all these embodiments is an insufficient resistance to reverse surge current loads, which usually lead to failures in the area of the guard ring (31) which is covered by the Schottky barrier layer (9). Also disadvantageous is the unavoidable voltage drop in the forward direction $I_{conduct} \times R_{\Delta xepi}$ which occurs across the epitaxial layer $\Delta x_{epi}$. FIG. 3 shows a detailed illustration of the guard ring area of a conventional arrangement.

The idea of the invention is explained in a first exemplary embodiment (FIG. 2) using a Schottky diode with a modified guard ring construction. To produce such a semiconductor component, a more weakly doped epitaxial layer (2) of the first conductivity mode is applied to a highly doped substrate (1) of the same conductivity mode, in this case for example a highly doped n-conducting substrate, with the specific resistance and layer thickness depending on the maximum reverse voltage $V_R$ to be achieved. It is to be noted that the additive voltage drop $I_{conduct} \times R_{\Delta xepi}$ which is caused by the residual epitaxial layer thickness $\Delta x_{Epi}$ is eliminated by the construction according to the invention of the region (3) of the second conductivity mode. The region of the second conductivity mode (3), in this case a p-conducting region, is introduced in such a manner that it penetrates into the highly doped region of the first conductivity mode (1), at the same time a shift of the homojunction (12) takes place from the highly doped region (1) to the more weakly doped region (2) in the direction of the semiconductor surface by autodoping of the more weakly doped layer (2) of the first conductivity mode. After the region (3) of the second conductivity mode has been introduced, the region (3) of the second conductivity mode is diffused through the epitaxial layer (2) of the first conductivity mode until it reaches the highly doped region (1) of the first conductivity mode and the highly doped region (1) of the first conductivity mode diffuses toward the epitaxial layer (2) of the first conductivity mode until the near-surface lateral diffusion $x_{lateral}$ is greater than the vertical advance of the diffusion front $y_{vertical}$. In the region (3) of the second conductivity mode, a rise in the guard ring doping of the same second conductivity mode is implanted in the near-surface area (5), in the case under consideration here a p+ doped area. The p/n+ junction (10) is shifted in the direction of the surface owing to autodoping of the homojunction with respect to the original depth of the junction from the substrate layer (1) of the first conductivity mode to the epitaxial layer (2) of the same conductivity mode.

The detailed illustration of the embodiment according to the invention of the guard ring area is shown in FIG. 4.

An LTO-CVD $SiO_2$ layer is then applied, in which the window for the deposition of the barrier metal (9) is opened.

After silicide forming of the barrier metal with the surface layer of the epitaxial layer (2) of the first doping and the areas of the regions (3) and (5) of the second conductivity mode, which are overlapped by the barrier metal, the contact metal is applied and structured in a known manner. The metallisation of the rear of the semiconductor arrangement takes place in a conventional manner.

In a further embodiment (FIG. 5), the linearization ring (4) with the same doping which is at a distance from the region (5) is produced simultaneously with the implantation of the more highly doped region (5) of the second doping, which linearization ring effects a homogenisation of the electrical field in the near-surface area (3) which is produced by the lateral diffusion $x_{lateral}$.

FIG. 6 shows an exemplary embodiment in which this linearization ring (4) is connected to the potential of the silicide layer via the contact metal (8) by means of an open contact face.

The embodiments presented in FIG. 5 and FIG. 6 result in a further stabilisation of the surge current behaviour. In FIG. 7 the arrangement of the linearization ring in the corners of the guard ring area is shown, in this case a deactivation of the electrical fields is particularly effective for a breakdown which occurs as late as possible. The regions (4) and (5) with an increased concentration of the second conductivity mode are corrected in accordance with the mask in the corner areas in such a manner that a uniform field distribution is achieved even with the lateral diffusion in the corner areas.

The doping types selected here for the purposes of illustration for describing the substance of the invention are without loss of generality, the conductivity modes can also be inverted.

The invention claimed is:

1. A semiconductor arrangement comprising:
   a doped substrate layer of a first conductive type;
   a doped epitaxial layer of the first conductive type deposited on the doped substrate layer, wherein the substrate layer is more highly doped than the epitaxial layer;
   a Schottky barrier, at least a portion of the Schottky barrier deposited on the epitaxial layer;
   a diffusion region of a second conductivity type embedded in the epitaxial layer, the diffusion region configured to diffuse through the epitaxial layer so as to be in contact with the substrate layer and form a direct junction with the substrate layer, the diffusion region configured to surround the Schottky barrier in an annular manner so that an outer profile of the Schottky barrier is positioned over the diffusion region; and
   a doped top region of the second conductivity type disposed on the diffusion region, wherein a portion of the doped top region is disposed between the Schottky barrier and the diffusion region, an outer profile of the doped top region is configured to be away from the epitaxial layer, and the doped top region is more highly doped than the diffusion region.

2. The semiconductor arrangement according to claim 1, wherein the outer profile of the doped top region has a lateral distance $X_{lateral}$ from the epitaxial layer, and a bottom of the top doped region has a vertical distance $Y_{vertical}$ from a bottom of the diffused region, and $X_{lateral}$ is larger than $Y_{vertical}$.

3. The semiconductor arrangement according to claim 1 further comprising a separate linearization ring of the second conductivity type disposed within an area of the diffusion region.

* * * * *